United States Patent
Benner et al.

[11] Patent Number: 6,035,503
[45] Date of Patent: Mar. 14, 2000

[54] MOUNTING TOOL

[75] Inventors: Rolf Benner, Herborn-Amdorf; Klaus-Dieter Bovermann, Breidenbach-Niederdieten, both of Germany

[73] Assignee: Rittal-Werk Rudolf Loh GmbH & Co. KG, Herborn, Germany

[21] Appl. No.: 08/901,355

[22] Filed: Jul. 28, 1997

[30] Foreign Application Priority Data

Jul. 30, 1996 [DE] Germany ............... 196 30 724

[51] Int. Cl.[7] ............................................. B23P 19/04
[52] U.S. Cl. ........................ 29/225; 29/235; 29/243.5; 29/243.56
[58] Field of Search ............... 29/225, 243.56, 29/243.5, 235

[56] References Cited

U.S. PATENT DOCUMENTS 4,578,851  4/1986  Song ........................................ 29/235

FOREIGN PATENT DOCUMENTS 7246580  12/1972  Germany .
4327067   2/1995  Germany .

Primary Examiner—David A. Scherbel
Assistant Examiner—Benjamin M. Halpern
Attorney, Agent, or Firm—Pauley Petersen Kinne & Fejer

[57] ABSTRACT

This invention relates to a mounting tool, wherein contact springs are fixed in place on a ridge by a press-on unit. A mounting tool used for a simple and secure mounting of the contact springs is created because the press-on unit has a rolling body which rolls on counter-surfaces of the contact springs and presses the contact springs on the ridge.

9 Claims, 1 Drawing Sheet

Fig.1

MOUNTING TOOL

BACKGROUND OF THE INVENTION

This invention relates to a mounting tool, wherein contact springs can be fixed in place on a ridge with a press-on unit.

Contact springs are used, for example, to place adjoining components of a housing on a common reference potential. Contact springs can be disposed in a transition area between two components. The contact springs can also assume a further function, namely that of a shield against high-frequency electromagnetic waves. For mounting, strip-shaped contact springs are manually placed on a ridge of one of the two adjoining components. The contact spring is then pressed on the ridge with a plate-shaped press-on unit, so that the contact spring makes a solid connection with the ridge.

Large forces are required for such a mounting tool if it is intended to apply large contact springs over a large distance on a ridge. The mounting step is also not easy to control, since in the course of pressing on the contact spring, the contact spring can jump off partial areas of the ridge and therefore is squeezed. The result of such mounting is then no longer satisfactory.

SUMMARY OF THE INVENTION

It is one object of this invention to create a mounting tool in which the mounting of the contact springs is possible in a simple manner.

The above object of this invention is attained with a press-on unit having a rolling body, which rolls on counter-surfaces of the contact springs and presses them on the ridge.

The contact spring can be continuously pressed on the ridge by the rolling body. In the process the rolling body is rolled off on the contact spring along the ridge. Mounting can be controlled because of the continuous pressing operation, since the connection between the ridge and the contact spring in a direction of placement movement of the tool always only occurs in one location. Therefore the contact spring can also not unintentionally jump off the ridge and thus assured mounting is accomplished.

Because the connection between the contact spring and the ridge always takes place at only one location, the amount of force needed for mounting is also less and can therefore be easily accomplished.

In accordance with one preferred embodiment of this invention, at least one guide body guides the rolling body in the longitudinal direction of the ridge.

The rolling body is oriented by the guide body. In the process the rolling body is forcibly guided along an intended path on the ridge. Depending on the embodiment of the contact spring, the guide body can also be used for positioning the contact spring on the ridge.

In one preferred embodiment according to this invention, which provides simple mounting, a first and a second guide body are connected to the rolling body, and the rolling body and the two guide bodies extend in a U-shape over the ridge. In the process the rolling body presses the contact spring on a front face of the ridge. The two guide bodies position the contact spring laterally against the flanks of the ridge. In this case, the contact spring is formed on the ridge in a friction-ally connected manner.

It is particularly advantageous if the detent spring is locked together with corresponding protrusions of the ridge.

If the rolling body and the guide bodies are combined into the press-on unit, and the press-on unit is connected to a holder by a rotating seating, a simple structure of the mounting tool is accomplished. Because the guide bodies, together with the rolling body, roll on the contact spring, the relative movements between the rolling body and the guide bodies on the one hand, and the contact spring on the other, are minimized.

The holder may have two legs, which extend over the press-on unit, and the legs may have bores which are aligned with each other. The bores are oriented and aligned to form a seating receptacle of the press-on unit. A seating bolt is pushed through the bores and the seating receptacle. The seating bolt can be a screw, for example, which rests with a screw head on the one leg and which has a thread that is screwed into a corresponding interior thread of the second leg.

The mounting tool in accordance with this invention can be mechanically employed in order to achieve automated mounting of the contact springs. But it is also possible to attach a handle to the holder for manual operation.

BRIEF DESCRIPTION OF THE DRAWINGS

This invention will be explained in more detail below with an exemplary embodiment represented in the drawings wherein.

DETAILED DESCRIPTION OF PREFERRED EMBODIMENTS

Figure 1:
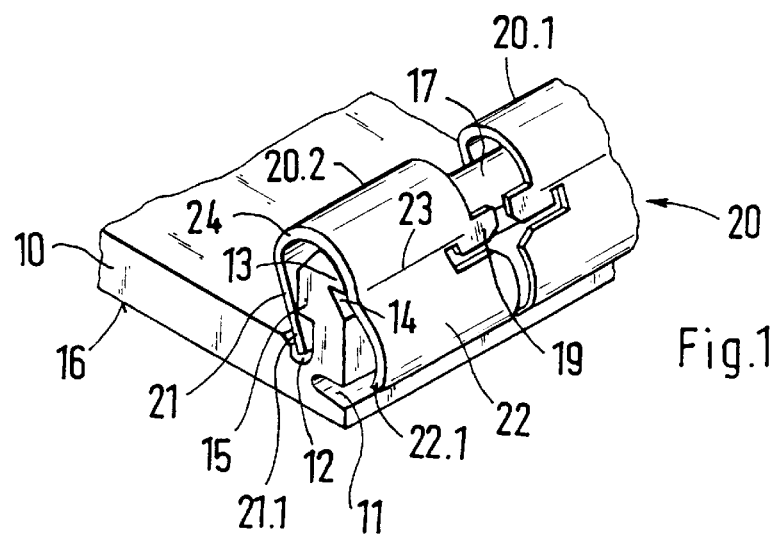
FIG. 1 is a perspective view of a section of a covering element and a contact spring.

A covering element 10 is shown in FIG. 1, on which a vertically upward projecting ridge 17 is formed. In this preferred embodiment the covering element 10 makes a transition on a back into the ridge 17 via a longitudinal slit 12. Adjoining the longitudinal slit 12, the ridge 17 forms a recess, so that a projecting support 15 is formed. An under-cut receptacle 14 is formed on a side of the ridge 17 opposite the support 15. The undercut is created at a nose-shaped projection 13. Further down on the ridge 17 a detent receptacle 11 in the form of a longitudinally oriented slit is cut into the ridge 17. A contact spring 20 can be attached to the ridge 17. The contact spring 20 can be endlessly wound off a coil. The contact spring 20 comprises individual spring elements 20.1, 20.2. The individual spring elements 20.1, 20.2 each has a support leg 21, which makes a U-shaped transition over a ridge 24 into a spring leg 22. The support leg 21 is inserted with a plug shoulder 21.1 into the longitudinal slit 12. This mounting position is shown in FIG. 1.

A recess 23 is provided on the spring leg 22, which in the mounted position springs into the receptacle 14 and is supported on the projection 13. On a free end the spring leg has an inward pointing bend which, with the contact spring 20 mounted, is received in the detent receptacle 11. Detent shoulders 19 are clicked out between the individual spring elements 20.1, 20.2, which are also interlockingly clamped behind the projection 13.

Figure 2:
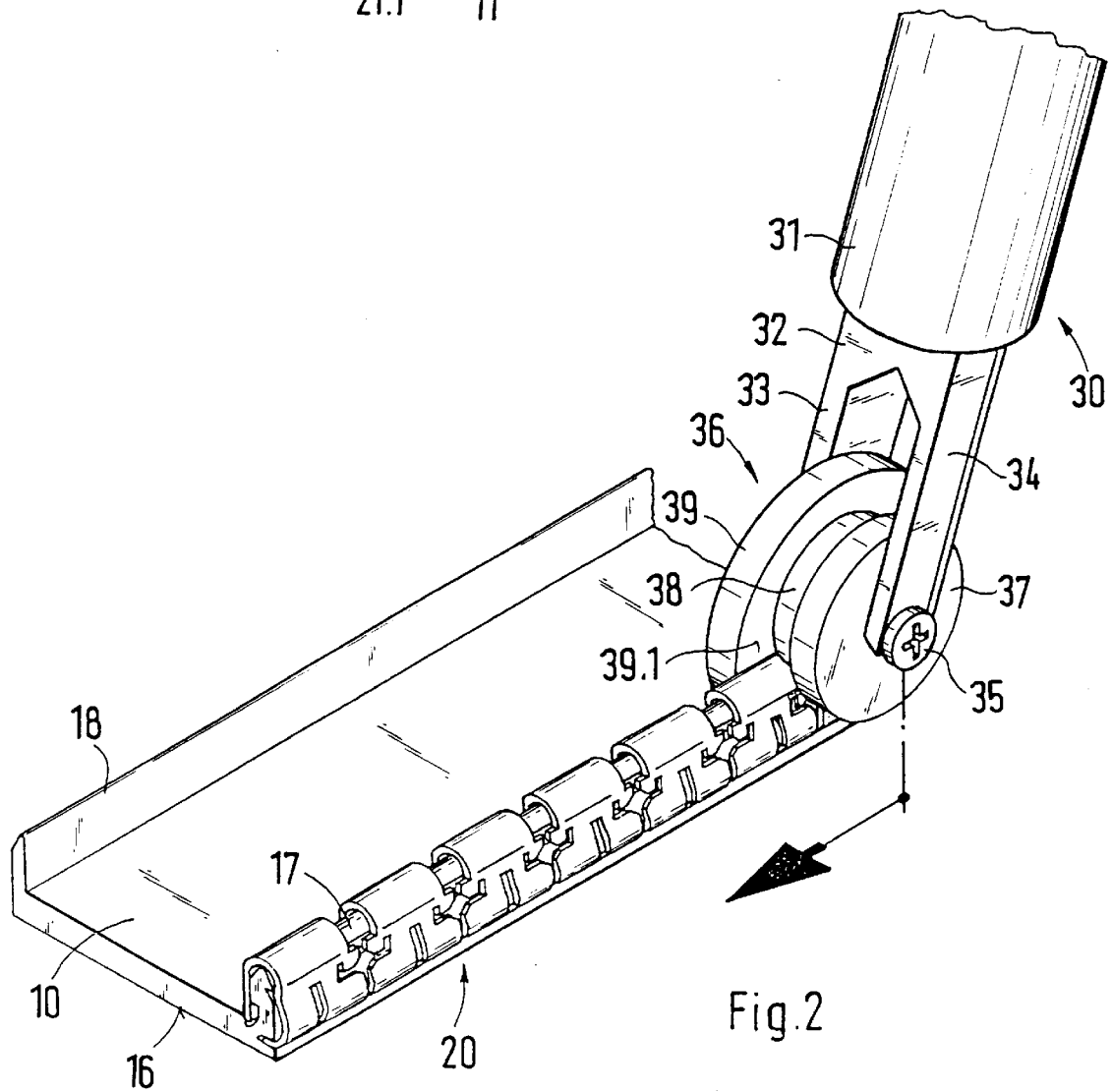
FIG. 2 is a perspective view of a covering element, as shown in FIG. 1, with a contact spring and a mounting tool.

The final mounted position of the contact spring 20 is shown in detail in FIG. 2. A mounting tool 30 is used for achieving the final mounting position. The mounting tool 30 has a handle 31, for manual operation. A holder 32 is connected to the handle 31. The holder 32 essentially comprises a bridge element, to which two parallel spaced-apart legs 33, 34 are connected. A press-on unit 36 is fixed in place between the two legs 33, 34. The press-on unit 36 comprises three disk-shaped components placed against each other. Here, the center component forms a rolling body 38; the two outer components are embodied as the first and second guide bodies 39 and 37. The rolling body 38 and the guide bodies 37, 39 are fixed in place on the legs 33, 34 by a seating 35. In this case the seating 35 is achieved by means of a threaded bolt, which is pushed through bores in the legs 33, 34, and of the rolling body 38 and the guide bodies 37, 39. Now, in order to mount the contact spring, it is first, as shown in FIG. 1, inserted with the plug shoulder 21.1 of the support leg on a spring element 20.1 or 20.2 into the longitudinal slit 12. Subsequently the tool 30 is placed on the connecting section 24 of the spring element 20 with a rolling body 38. If now a pressure is exerted on the rolling body 38 in a direction toward the contact spring 20 by means of the handle 30, the recess 23 and the detent shoulder 19 snap into the receptacle 14. The bend 22.1 enters the detent receptacle 11. Now the tool 30 can be rolled off with the rolling body 38 on the transition section 24. In the process the first guide body is guided along the support leg 21. Because of this the plug shoulder 21.1 is guided into the longitudinal slit 12. The second guide body 37 guides the spring leg 22 with a recess into the receptacle 14. The two guide bodies 37 and 39 cause the rolling body 38 to move on a preselected path along the ridge 17. Because of this mounting is considerably simplified, because the rolling body 38 can be guided rapidly and precisely along the ridge 17.

As shown in FIG. 2, the contact spring 20 can be securely fixed in place on the ridge 17 by means of the tool 30. In this case the contact spring 20 is clamped in a spring-elastic manner. The support leg 21 is tightened against the support 15. The recess 23 and the detent shoulders 19 are maintained behind the projection 13 because of the spring elasticity.

What is claimed is:

1. A mounting tool in combination with a plurality of contact springs, the mounting tool having a press-on unit for fixing the contact springs on a ridge, the combination comprising:

the contact springs (20) each having a support leg (21) transitioning over a ridge (24) into a spring leg (22) forming a U-shape of each of the contact springs (20), the spring leg (22) having an inwardly bent free end and a recess (23) between the free end and the ridge (24); and the press-on unit (36) having a rolling body (38) mounted between a first guide body (39) and a second guide body (37), upon rolling contact of the press-on unit (36) on each of the contact springs (20) the rolling body (38) contacting the ridge (24), the support leg (21) guiding the first guide body (39), and the second guide body (37) contacting the spring leg (22) thereby forcing the recess (23) into a receptacle (14) formed by an undercut on a side of the ridge (17) and forcing the free end of the spring leg (22) into a receptacle (11) of the ridge (17).

2. In the combination in accordance with claim 1, wherein at least one of the guide bodies (37, 39) guides the rolling body (38) along a longitudinal direction of the ridge (17).

3. In the combination in accordance with claim 2, wherein the first guide body (39) and the second guide body (37) are connected to the rolling body (38) and extend over the ridge (17) in the U-shape.

4. In the combination in accordance with claim 3, wherein the press-on unit (36) is connected to a holder (32) with a rotating seating (35).

5. In the combination in accordance with claim 4, wherein the holder (32) has two legs (33, 34) which extend over the press-on unit (36), the legs (33, 34) have two bores aligned with each other, the bores are aligned with a seating receptacle of the press-on unit (36), and a seating bolt is mounted through the bores and the seating receptacle.

6. In a mounting tool in accordance with claim 5, wherein a handle (31) is connected with the holder (32).

7. In the combination in accordance with claim 1, wherein the press-on unit (36) is connected to a holder (32) with a rotating seating (35).

8. In the combination in accordance with claim 7, wherein the holder (32) has two legs (33, 34) which extend over the press-on unit (36), the legs (33, 34) have two bores aligned with each other, the bores are aligned with a seating receptacle of the press-on unit (36), and a seating bolt is mounted through the bores and the seating receptacle.

9. In the combination in accordance with claim 1, wherein a handle (31) is connected with a holder (32) that extends over the press-on unit (36).

* * * * *